US012575430B2

(12) United States Patent
Schuderer et al.

(10) Patent No.: US 12,575,430 B2
(45) Date of Patent: Mar. 10, 2026

(54) POWER SEMICONDUCTOR MODULE

(71) Applicant: Hitachi Energy Ltd, Zürich (CH)

(72) Inventors: Juergen Schuderer, Zürich (CH); Chunlei Liu, Oberrohrdorf (CH); Slavo Kicin, Zürich (CH); Giovanni Salvatore, Gorizia (IT); Fabian Mohn, Ennetbaden (CH)

(73) Assignee: HITACHI ENERGY LTD, Zurich (CH)

( * ) Notice: Subject to any disclaimer, the term of this patent is extended or adjusted under 35 U.S.C. 154(b) by 550 days.

(21) Appl. No.: 18/028,098

(22) PCT Filed: Sep. 23, 2021

(86) PCT No.: PCT/EP2021/076152
§ 371 (c)(1),
(2) Date: Mar. 23, 2023

(87) PCT Pub. No.: WO2022/078725
PCT Pub. Date: Apr. 21, 2022

(65) Prior Publication Data
US 2023/0335472 A1     Oct. 19, 2023

(30) Foreign Application Priority Data
Oct. 15, 2020     (EP) ..................................... 20202018

(51) Int. Cl.
*H01L 23/495*          (2006.01)
*H01L 23/00*           (2006.01)
(Continued)

(52) U.S. Cl.
CPC .... *H01L 23/49562* (2013.01); *H01L 23/3107* (2013.01); *H01L 23/3675* (2013.01);
(Continued)

(58) Field of Classification Search
CPC ...................................................... H01L 23/481
See application file for complete search history.

(56) References Cited

U.S. PATENT DOCUMENTS 9,648,722 B2     5/2017   Gerhäußer
9,681,558 B2     6/2017   Chen et al.
(Continued)

FOREIGN PATENT DOCUMENTS

DE       102016125657 A1    6/2018
EP           1429384 A1    6/2004
(Continued)

OTHER PUBLICATIONS

Dijkhuizen et al., "Research Area Power Electronics, VSC HVDC Strategic Technology Plan", Key technologies in the market, ABB Corporate Research, 2019, 7pages.

*Primary Examiner* — Yu-Hsi D Sun
(74) *Attorney, Agent, or Firm* — PROCOPIO, CORY, HARGREAVES & SAVITCH LLP

(57)     ABSTRACT

The invention relates to a power semiconductor module comprising a conductive base, a conductive top, and at least two power semiconductor devices arranged between the conductive base and the conductive top. The semiconductor devices are each configured for a current of at least 1 A and/or for a voltage of at least 50 V. An insulating spacer layer is arranged on the power semiconductor devices and at least partially between the conductive base and the conductive top. At least two vertical connection elements pass from the power semiconductor devices through the spacer layer and conductively connect the conductive top with the power semiconductor devices. The spacer layer and the vertical connection elements are configured for compensating height differences of the power semiconductor devices.

20 Claims, 6 Drawing Sheets

Figure 1:
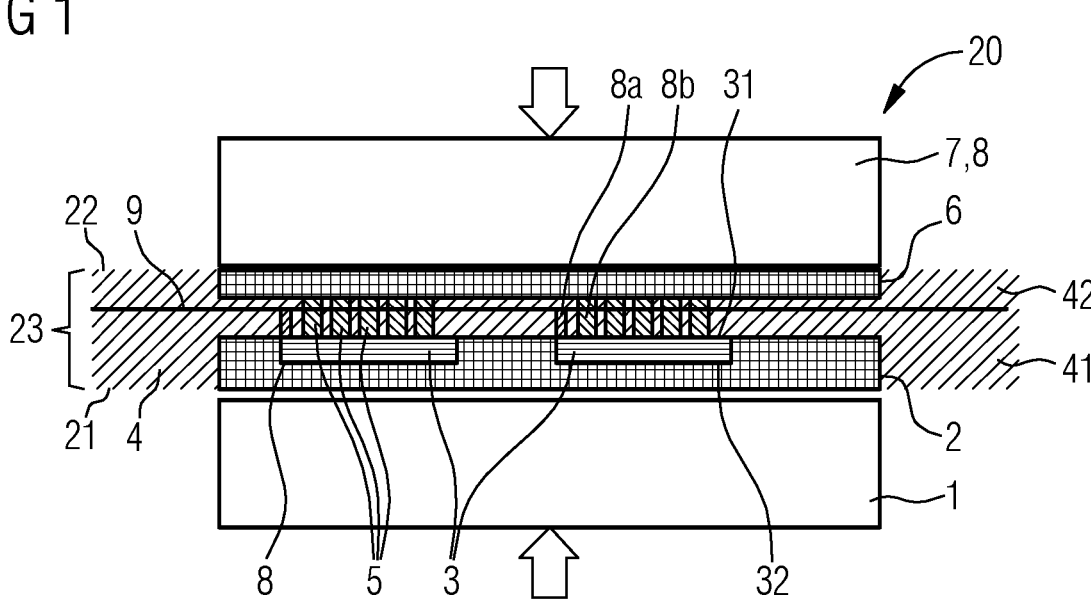

(51) Int. Cl.
H01L 23/31 (2006.01)
H01L 23/367 (2006.01)
H01L 25/065 (2023.01)

(52) U.S. Cl.
CPC ........ H01L 23/49575 (2013.01); H01L 24/32 (2013.01); H01L 24/45 (2013.01); H01L 25/0657 (2013.01); H01L 2224/32258 (2013.01); H01L 2224/49111 (2013.01); H01L 2225/06506 (2013.01); H01L 2924/1304 (2013.01); H01L 2924/1811 (2013.01)

(56) References Cited

U.S. PATENT DOCUMENTS

| | | | |
|---|---|---|---|
| 2010/0038774 A1 | 2/2010 | Zhang et al. | |
| 2011/0266665 A1 | 11/2011 | Gowda et al. | |
| 2013/0146991 A1 | 6/2013 | Otremba et al. | |
| 2016/0111554 A1 | 4/2016 | Kuwahara et al. | |
| 2022/0352137 A1* | 11/2022 | Wang ................... | H01L 23/051 |

FOREIGN PATENT DOCUMENTS

| | | | |
|---|---|---|---|
| EP | 1672692 A1 | 6/2006 | |
| GB | 1353602 A | 5/1974 | |
| WO | 2012/152316 A1 | 11/2012 | |
| WO | 2013/139373 A1 | 9/2013 | |
| WO | 2018/050713 A1 | 3/2018 | |

* cited by examiner

POWER SEMICONDUCTOR MODULE

The present application is a national stage entry of International Patent Application No. PCT/EP2021/076152, filed on Sep. 23, 2021, which claims priority to European Patent Application No. 20202018.6, filed on Oct. 15, 2020, which are both hereby incorporated herein by reference as if set forth in full.

The invention relates to a power semiconductor module. Moreover, a power semiconductor stack is provided. The invention also relates to a method for manufacturing the power semiconductor module.

Documents U.S. Pat. Nos. 9,648,722 B2 and 9,681,558 B2 refer to power semiconductor components comprising embedded semiconductor chips.

Documents DE 10 2016 125 657 A1, EP 1 672 692 A1, US 2011/0266665 A1, US 2013/0146991 A1, US 2010/0038774 A1, US 2016/0111554 A1 and GB 1 353 602 A refer to semiconductor devices.

It is therefore a problem to be solved to provide a power semiconductor module and a power semiconductor stack that can efficiently be electrically connected.

This object is achieved, inter alia, by the power semiconductor module, by the power semiconductor stack and by the method as defined in the independent claims. Exemplary further embodiments are detailed in the dependent claims.

For example, the power semiconductor module comprises a plurality of semiconductor chips between a conductive base and a conductive top. A spacer layer with vertical connection elements is also located between the conductive base and the conductive top, and by means of the spacer layer different thicknesses of the semiconductor devices due to manufacturing tolerances can be compensated for so that the overall power semiconductor module can be of plane-parallel fashion.

In at least one embodiment, the power semiconductor module comprises

- at least one conductive base which may be a first leadframe,
- at least two power semiconductor devices conductively arranged on the conductive base, the semiconductor devices are each configured for a current of at least 1 A and/or for a voltage of at least 50 V,
- an insulating spacer layer arranged on the least two power semiconductor devices and on the at least one base compensating possible height differences of the least two power semiconductor devices,
- a conductive top, that may be a second leadframe, arranged on a side of the spacer layer remote from the conductive base, and
- at least two vertical connection elements passing from the power semiconductor devices through the spacer layer and conductively connecting the conductive top leadframe with each one of the at least two power semiconductor devices so that the spacer layer and the vertical connection elements together are configured for compensating height differences of the power semiconductor devices.

High voltage direct current, HVDC, and/or flexible alternating current transmission system, FACTS, power electronics applications and high-power medium voltage, MV, drives require high-current capability power semiconductor discretes and modules that are operating in series connection and that may be arranged in presspack stacks or valves. In contrast to industrial power modules, these presspack modules do not have insulated power terminals but provide a vertical current flow through the module package from a topside to a backside electrode.

Said presspack module packages are on one hand provided as rigid presspack modules based on parallel insulated-gate bipolar transistors, IGBTs, that are contacted from the topside via a spring-less assembly and often involve some strain buffers or elastic features to accommodate height tolerance of the semiconductor devices. On the other hand, there can be spring-loaded approaches based on a mechanical spring-loaded press-kit that ensures a reliable topside contact.

However, rigid presspacks have an issue of uniform pressure distribution across a large number of parallel semiconductor devices. This problem occurs since semiconductor device heights and semiconductor device soldering/assembly tolerances cannot be kept small enough to allow for a homogeneous pressure contact. Adding of strain buffer and conductive diaphragms are needed for compensation. In consequence, such a presspack module assembly would become complicated, expensive, involves many dry contacts, and would also be limited in current capability.

Spring-loaded presspacks have an issue of costs since each semiconductor device requires an own presskit based on several disc springs, a current bypass, strain buffers and support frames to align the springs to the semiconductor devices. In addition, due to the spring construction on top, heat transfer is limited to mainly single-side cooling via the backside of the power semiconductors only.

Finally, both of these module types are not suited for future silicon carbide, SiC for short, or other wide bandgap material based high-power presspacks requiring paralleling of dozens of small SiC semiconductor devices that would either lead to too many springs, or to too many low-tolerance rigid contacts in parallel.

The power semiconductor module described here basically applies multichip embedding to realize a large-size, low-profile, height-tolerance corrected module, for example, a presspack module, with uniform pressure distribution, which can be sandwiched between a conductive base plate and a conductive top plate acting, for example, as coolers. Whereas for classical PCB embedding a backside lamination of the conductive base, for example, an insulated Cu base layer, is applied, such a step can be omitted for the power semiconductor module described here and only a top side lamination of the base leadframe with the spacer layer may be conducted, followed by formation of the at least two vertical connection elements through the spacer layer for electrically connecting the power semiconductor devices. Thanks to the spacer layer, height differences of the power semiconductor devices, for example, between electrical contacts/electrodes of said power semiconductor devices, can be compensated, thereby avoiding disc springs or the like, resulting in a much simpler and cheaper setup, which overcomes the before described issues of a non-uniform pressure distribution.

The power semiconductor module may comprise the conductive base plate and the conductive top plate, whereby the conductive base is arranged on the base plate and the conductive top plate is conductively arranged on the conductive top. The conductive base can be conductively arranged on the base plate. The top plate and/or the base plate can be congruent with the at least one conductive base and/or with the at least one conductive top.

The conductive top can be formed as one piece with the top plate. The conductive top can be provided as top layer, as a plated or otherwise deposited layer, for example, as a metal or otherwise conductive layer, and/or as a pole piece.

The bottom side of power semiconductor devices can be electrically and/or thermally contacted to the conductive base, while the bottom side of the power semiconductor devices can be electrically and/or thermally contacted to the at least two vertical connection elements.

The conductive top and/or the conductive base may be provided as a metal sheet or plate and/or comprising electrical contact elements. The conductive base may be directly, gap-free and/or in a touching manner attached to the power semiconductor devices, the insulating layer and/or the spacer layer, for example, by bonding like soldering, sintering, adhesive bonding or the like. The conductive top may be directly, gap-free and/or in a touching manner attached to the top plate, the spacer layer and/or the at least two vertical connection elements, for example, by bonding or the like.

The at least two vertical connection elements can be provided as vias, vertical interconnection access, or as metal inserts, such as, for example, posts, bond spacers and the like, and/or as electrical connections between the conductive top with each of the at least two power semiconductor devices. The at least two vertical connection elements can be inserted by first drilling the spacer layer and thereafter inserting the least two vertical connection elements in respective bores, until reaching a top side of the respective power semiconductor device, thereby contacting each power semiconductor device homogeneously.

A depth of the vertical connection element, for example, a top side spacer layer thickness, can be optimized to yield enough dielectric insulation distance from the power semiconductor topside edge to the top plate. If a standard raw material layer for the spacer layer is not thick enough, for example, multilayer lamination of a plurality of laminated layers can be applied as the spacer layer. For example, in a 1.2 kV rated embedded power semiconductor module a depth of 0.1 mm can be used. As an example, when scaling the insulation distances linearly, a depth of about 0.4 to 0.5 mm may be required for 5.2 kV rated power semiconductor devices.

Such a connection element formation can be done either by laser or mechanical drilling. Large diameter connection elements can be foreseen providing a high current capability and an excellent thermal buffer for overload conditions, such as improved SOA, safe operating area. The vertical connection elements may comprise Cu.

The spacer layer can be made from prepreg materials as used in semiconductor packaging, with a filler and a matrix. The filler material may be a fibrous material like fiber glass, cellulose fiber, cotton fiber. Typical matrix materials may be epoxy resin, phenolic resin, polyester. For example, the spacer layer may be a prepreg made from FR-2 (phenolic resin matrix with cotton paper filler), FR-3 (epoxy resin matrix with cotton paper filler), FR-4 (epoxy resin matrix with woven glass filler), FR-6 (polyester matrix with matte glass filler), G-10 (epoxy resin with woven glass filler), CEM-2 (epoxy resin with woven glass filler), CEM-3 (epoxy resin with non-woven glass filler), CEM-4 (epoxy resin matrix with woven glass filler), CEM-5 (polyester matrix with woven glass filler). Also, materials used for flex layers in hybrid-flex circuit board substrates, like a polyimide film layer, may be used for the spacer layer.

Prepreg means "pre-impregnated" composite fibers where a thermoset polymer matrix material, such as epoxy, or a thermoplastic resin is already present. The fibers included often take the form of a weave and the matrix is used to bond them together and to other components during manufacture. The thermoset matrix is on first only partially cured to allow easy handling; this material may require cold storage to prevent complete curing. Complete polymerization and/or curing is done after applying the prepreg. Hence, composite structures built of prepregs will mostly require an oven or autoclave to cure. Prepreg allows one to impregnate the fibers on a flat workable surface, or rather in an industrial process, and then later form the impregnated fibers to a shape which could prove to be problematic for the hot injection process.

The spacer layer can also be provided as a printed circuit board, PCB, for example, as a plastics material or a plastics/fiber composite as used for substrates of printed circuit boards. Thus, the spacer layer can embed the power semiconductor devices from a top side. Using such an approach might require an application of underfill materials to realize a void-free insulation system. Alternatively to such an embedding, the power semiconductor devices can be embedded by transfer molding or compression molding with epoxy mold compound materials that may offer better humidity withstand and temperature resistivity.

The spacer layer may comprise redistribution layers, for example, applied by thin-film dielectrics and electro-plating.

The spacer layer may also comprise a parylene conformal coating. Parylene can, for example, be evaporated at large scale and ensures conformal coating.

Furthermore, embedding low-temperature co-fired ceramics such as Alumina, or sputtering of $SiO_2$ or other inorganic dielectrics could be done for realizing the spacer layer, as it advantageously provides a higher thermal conductivity to reduce the chip temperature in operation. These methods would advantageously avoid the requirement of underfill materials and additional manufacturing steps.

According to an exemplary implementation, the least two power semiconductor devices are partly or completely bonded and/or sintered into pre-fabricated cavities of the conductive base which can ease the topside lamination step.

The at least two power semiconductor devices can be provided as Si, wide bandgap power semiconductor chips such as SiC, GaN or other power semiconductor chips.

The power semiconductor devices may be provided with a metallization, like a Cu metallization on top, and an Al metallization on the bottom sides. The upper and opposite lower sides can be provided as electrical contacts/electrodes, for example, as emitter and collector, or vice versa. The lower sides may comprise a bondable metallization. in such a way the upper and opposite lower sides can electrically contact the conductive base and the vertical connection elements, so that, in a side view, current flows in vertical direction through the power semiconductor devices, respectively, the power semiconductor module becomes possible. For example, 'vertical direction' means in a direction perpendicular with the upper and opposite lower sides of the power semiconductor device, wherein a tolerance of at most 15° or at most 5° or at most 1° may apply. The lower sides may also be referred to as back sides.

Each power semiconductor device may comprise a gate contact/electrode arranged on the same side as the emitter/source or the collector/drain contact/electrode. One, two, three, four, five, six, seven or even more vertical connection elements may be associated to each power semiconductor device, for example, arranged distant to each other.

The power semiconductor devices may be selected from the following group: a metal-oxide-semiconductor field-effect transistor (MOSFET), a metal-insulator-semiconductor field-effect transistor (MISFET), an insulated-gate bipolar transistor (IGBT), a bipolar junction transistor (BJT), a thyristor, a gate turn-off thyristor (GTO), a gate commutated thyristor (GCT), a junction gate field-effect transistor (JFET), and a diode. All the power semiconductor devices can be of the same type, or there are different kinds of power semiconductor devices in the power semiconductor module.

The power semiconductor module may be configured for electric power conversion, for example, as a DC to AC converter, and may comprise two, four, six, eight or more power semiconductor devices, arranged, for example, in an array of three by two, and each distant to each other. The power semiconductor devices may have a disc-like or rectangular shape, seen in top view of the upper sides. The top plate, the base plate, the conductive top and/or the conductive base may have a disc-like or rectangular shape and/or corresponding shape and/or may completely or partially overlap with all or with some of the power semiconductor devices.

In another exemplary implementation, the power semiconductor module comprises an electric wiring like a gate conductor connected to respective electric contacts like gates of the at least two power semiconductor devices and embedded within the spacer layer. In the following, the electric wiring is exemplarily referred to as the gate conductor, but the aspects explained in connection with the gate conductor can of course apply to other types of electric wiring than gate conductors as well. Moreover, the electric wiring cannot only comprise the gate conductor but could also comprise other conductors like conductors for sensors and/or other control circuitry.

The gate conductor, that is, the electric wiring, can be provided as a conductor extending partly or completely in parallel and distant to the conductive top through the spacer layer being connected, for example, to all electrodes like gates of all power semiconductor devices. The gate conductor can also be provided as a pair of gate and auxiliary emitter/source conductor for low-gate inductance circuit design. The gate conductor may further lead out of the spacer layer at a lateral side of the spacer layer.

The spacer layer of the power semiconductor module may be configured in multi-layer fashion comprising a plurality of sub-layers, whereby the electric wiring like the gate conductor can be sandwiched between the sub-layers. In this regard, in a further exemplary implementation, the spacer layer comprises at least two sub-layers arranged one above the other, whereby the electric wiring is provided between the at least two insulating sub-layers. With such implementations the electric wiring can be easily integrated within the power semiconductor module when manufacturing said module.

The electric wiring like the gate conductor may be a common signal line for the at least two semiconductor devices or may be separate signal lines to control the semiconductor devices individually.

In a further exemplary implementation, the base plate and/or the top plate comprise a cooling channel for cooling the power semiconductor module and, thus, the at least two power semiconductor devices. The cooling channel may be configured for a moving fluid, for example, air, another cooling gas or a liquid. In such regard the base plate and/or the top plate are also referred to as cooler. Thus, as cooling capability can be supplied to both sides of the power semiconductor devices without any spring and/or strain buffers, and cooling efficiency is increased. The conductive top can be bonded to the top plate to further increase the cooling capability.

In another exemplary implementation, the power semiconductor module comprises a plurality of conductive bases like leadframes or leadframe parts, at least two power semiconductor devices, spacer layers, conductive tops like leadframes and at least two vertical connection elements arranged consecutively one above the other. In such a way, a plurality of laminated presspack units each comprising the conductive base, the at least two power semiconductor devices, the spacer layer, the conductive top and the least two vertical connection elements can be clamped between the top plate and the base plate, which can cool all said laminated presspack units.

In a further exemplary implementation, the conductive base and/or the conductive top is formed by a leadframe or by a metal foil or by a metal plating that comprises Cu, Mo, Fe, Ni and/or Co, and may be, for example, of an alloy like CuMo, FeNi called Invar or FeNiCo called Kovar. The power semiconductor devices can be bonded on the conductive base and/or the conductive top. Hence, the conductive base and/or the conductive top can be provided as thick-metal leadframes.

The conductive base and/or the conductive top can be based on Cu and the bonding can be conducted by sintering into cavities of the respective leadframe or foil. To increase the die attach reliability and/or electric arc resistance of the spacer layer, Mo or CuMo leadframes and/or sheets can be used for the conductive base and/or the conductive top.

If the conductive base and the conductive top are formed of leadframes, then it is possible that these leadframes have different material compositions and/or different thicknesses.

In another exemplary implementation, the power semiconductor module comprises at least two conductive bases and/or at least two conductive tops separated from each other and each associated to one of the at least two power semiconductor devices. The at least two conductive bases and/or the at least two conductive tops may have similar or identical dimensions and/or longitudinal extensions, and/or may not overlap, seen in top view of the upper sides of the power semiconductor devices. The upper sides may also be referred to as top sides.

All the power semiconductor devices and all the conductive bases and the conductive tops can be connected to the same spacer layer. The conductive bases and/or the conductive tops may in longitudinal direction overtop the power semiconductor device and/or be arranged besides each other. Such separation of one common conductive base and/or one conductive top into at least two conductive bases and/or the conductive tops into smaller pieces allows for reducing potential issues of warpage.

All the individual conductive bases can be arranged in a common plane in parallel with the upper sides of the power semiconductor device, and all the conductive tops can be arranged in another common plane in parallel with the upper sides of the power semiconductor device. Hence, all the conductive bases and conductive tops together can define two parallel mounting planes, and the power semiconductor devices are arranged between these planes.

In other words, the mounting planes include a top face and a bottom face of a core of the power semiconductor device, said core is formed by the conductive top, the conductive base and the spacer layer and the components embedded therein. The core is configured to be core is configured to be electrically contacted by a dry contact, that is, by pressing electrically conductive surfaces against the mounting planes. Because the mounting planes can be of high quality, pressure can be applied homogeneously to the mounting planes avoiding fracture of the power semiconductor devices.

For example, the mounting planes are in parallel with each other with a tolerance of at most 5 μm or of at most 10 μm and/or of at most 0.1° or of at most 0.3°. Alternatively or additionally, a lateral extent of the power semiconductor module, that is, in a direction in parallel with the mounting planes, may be at least 4 cm or at least 8 cm and/or may be at most 0.5 m or at most 0.3 m.

In a further exemplary implementation, the power semiconductor module comprises at least one creepage distance enhancer arranged at a lateral side of the spacer layer and/or wherein the spacer layer comprises a passivation coating. As the power semiconductor module, the at least one conductive top, the at least one conductive base and the spacer layer may have a very low profile, the creepage distance enhancer may be required for advantageously enhancing creepage distances to avoid surface flashover. That is, by means of the creepage distance enhancer electric strength and withstand voltage can be increased.

For example, lateral stand-outs of the spacer layer extending in longitudinal direction the conductive top and/or the conductive base may be equipped with a ring or a frame as creepage distance enhancer, for example, by gluing a low-cost plastic part to a rim of the spacer layer. In addition, passivation coatings can be applied to the spacer layer, on one or on both sides of the spacer layer extending beyond the at least one conductive base and/or the at least one conductive top.

In another exemplary implementation, the power semiconductor module comprises a gate drive logic component connected to the gates of the at least two power semiconductor devices, a sensor and/or a communication component arranged onto or within the spacer layer. When adding the gate drive logic components directly onto or within the spacer layer, a very low-inductance and symmetric gate control can be achieved, which is advantageous to enable fast switching modules. The sensor may include a sensor for temperature, magnetic field, humidity, vibration, strain, and/or other quantities of interest. The communication component may include a radiofrequency, infrared, optical, inductive and/or other transceivers. Thereby, embedded metallization layers and structures within the spacer layer may act as micro-patch or dipole antenna for RF/microwave communication.

In a further exemplary implementation, the power semiconductor module comprises at least two switches each associated to one of the at least two power semiconductor devices and configured for switching a gate of the respective power semiconductor device. in such a way each power semiconductor device can be switched individually, for example, in case a short-circuit is detected, which then does not affect an overall gate control of the other power semiconductor devices. Such individual gate control can provide further advantages like releasing stress of an aged or close-to-failure power semiconductor device, turning-off/fusing-out a defect power semiconductor device on-time avoiding short-circuits, and turning on parallel semiconductor devices to avoid arcing for series connected module applications.

As the gate control is embedded in the spacer layer, additional wiring for the individual switches can be easily realized. in such a way each power semiconductor device can be individually controllable, for example, by an electronic switch such as a semiconductor or by a fuse as a switch. In this regard, each power semiconductor device may comprise its own gate drive logic, for example, embedded within the spacer layer. Alternatively, a single gate drive logic can be provided for driving the power semiconductor devices. Thus, gate lines connected to the gate drive logic can be separated, for example, galvanically isolated. In one scenario, if one semiconductor device fails and thereby shortens its gate and emitter permanently, the power semiconductor device cannot be turned on anymore. As all semiconductor devices may be connected in parallel, the entire module is permanently turned-off. However, current needs to continue and could lead to electric arcing and explosion. With said switch, having detected the failure, all parallel semiconductor switches can be turned on to avoid arcing.

A power semiconductor stack is additionally provided. The power semiconductor stack may comprise a plurality of the power semiconductor modules as described before. Features of the power semiconductor module are therefore also disclosed for the power semiconductor stack and vice versa.

In at least one embodiment, the power semiconductor modules in the power semiconductor stack are pressed together with a pressure of at least 0.5 kN/cm$^2$ or of at least 0.8 kN/cm$^2$. Optionally, said pressure is at most 10 kN/cm$^2$ of at most 5 kN/cm$^2$. Accordingly, there is only a dry contact between adjacent power semiconductor modules. It is possible that the power semiconductor modules are stacked one above the other in a congruent manner.

According to at least one embodiment, the power semiconductor stack comprises a plurality of the power semiconductor modules which are arranged one above the other, whereby by means of example between two adjacent power semiconductor modules the base plate of each upper power semiconductor module forms the top plate of each respective lower power semiconductor module. Said base plate of each upper power semiconductor module forming the top plate of each respective lower power semiconductor module may comprise additional base/top or other plates arranged between the upper power semiconductor module and the lower power semiconductor module so that each power semiconductor module may comprise its own top plate or base plate, respectively.

Said power semiconductor stack and/or power semiconductor module can be housed in a housing and/or may comprise high voltage, HV, terminals connected to the upmost top plate and/or to the lowest base plate. Said terminals may be passed through the housing. The housing may comprise a ceramic material, for example, provided as round hockey puck or a rectangular housing, providing a hermetic ceramic or metal environment and explosion protection.

Alternatively, the housing may comprise a plastic frame housing providing explosion protection. Further alternatively, the housing can be provided as an explosion-proof box, with eventually adding an encapsulation material inside the box. The encapsulation material may provide dielectric insulation, mechanical and/or structural stability, thermal management by heat conduction, ion and/or humidity gettering, shock absorption and/or electric arc absorption.

Furthermore, a method for manufacturing a power semiconductor module is also provided. The manufactured power semiconductor stack may be configured as indicated in connection with at least one of the above-stated embodiments and may comprise a plurality of the power semiconductor modules as described before. Features of the method are therefore also disclosed for the power semiconductor module and the power semiconductor stack and vice versa.

In at least one embodiment, the method comprises the following steps, for example, in the stated order:

Conductively bonding at least two power semiconductor devices on at least one conductive base, Arranging an insulating spacer layer on the least two power semiconductor devices and on the at least one conductive base, Passing at least two vertical connection elements through the spacer layer, or attaching prior to creating the spacer layer bond spacers as the at least two vertical connection elements to the at least two power semiconductor devices, for conductively connecting each of the at least two power semiconductor devices, thereby compensating possible height differences of the least two power semiconductor devices, and Arranging at least one conductive top on the spacer layer and conductively on the least two vertical connection elements.

Said method allows for advantageously manufacturing a power semiconductor module not requiring any springs, strain buffers and support frames to align the springs to the semiconductor device devices or the like for achieving a uniform pressure distribution across a large number of electrically in parallel installed semiconductor devices. Instead, the spacer layer compensates possible height tolerances, thus allowing for a homogeneous pressure contact. Arranging the insulating spacer layer may comprise laminating one or a plurality of prepreg layers.

In an exemplary implementation, the method comprises the steps of

Conductively arranging the conductive base leadframe with the least two power semiconductor devices, the at least two vertical connection elements and the conductive top leadframe on a conductive base plate, and Conductively arranging a conductive top plate on the top leadframe.

In an exemplary implementation, electrical contacts between the base plate and the at least one conductive base, and between the top plate and the at least one conductive top, respectively, are dry contacts by pressing the afore-mentioned components together, for example, with a pressure of at least 0.5 kN/cm².

In a further exemplary implementation of the method, the at least two power semiconductor devices are arranged on and/or are least partly positioned into cavities of the at least one conductive base.

In another exemplary implementation, the method comprises the steps of

Arranging a gate conductor connected to respective gates of the at least two power semiconductor devices on the spacer layer, and Arranging a second insulating spacer layer on the gate conductor and on the spacer layer.

That is, an electric wiring is produced between two sub-layers of the spacer layer, the sub-layers can be prepregs or can also be otherwise coated or casted or molded sub-layers. The electric wiring is thus embedded between the sub-layers, and the electric wiring can constitute the at least one gate conductor.

Further implementations and advantages of the method are directly and unambiguously derived by the person skilled in the art from the module and the stack as described before.

These and other aspects of the invention will be apparent from and elucidated with reference to the implementations described hereinafter.

Figure 8:
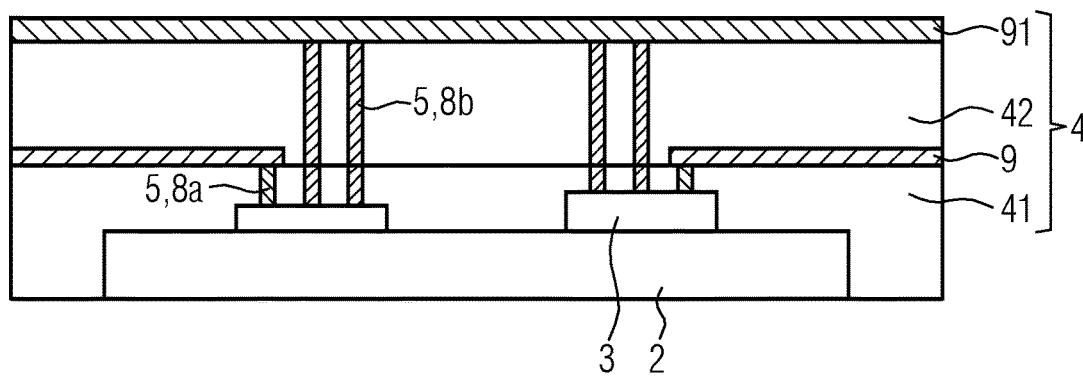
Figure 9:
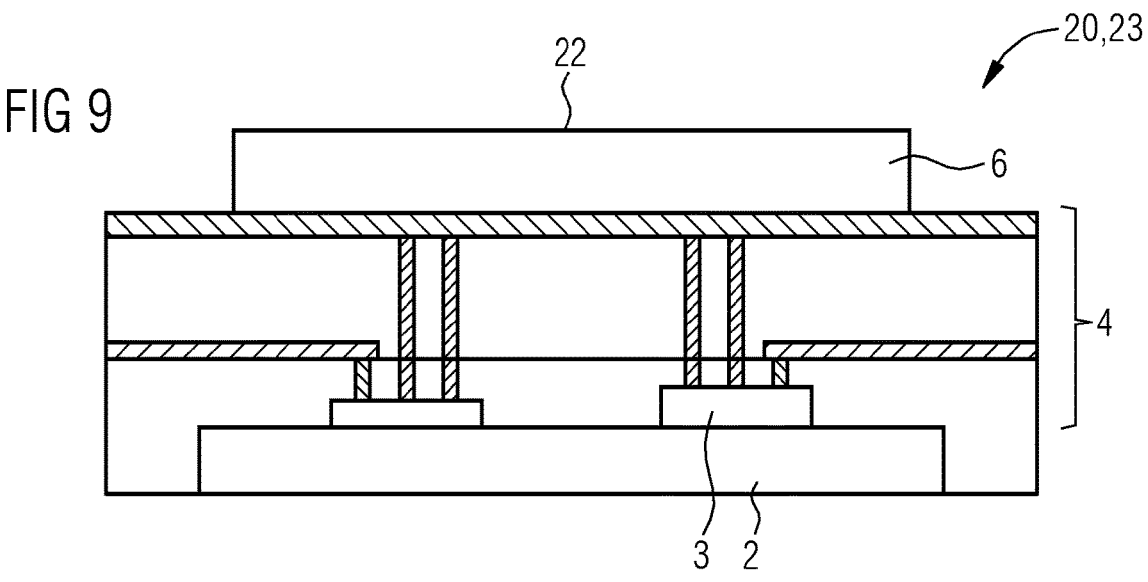
Figure 10:
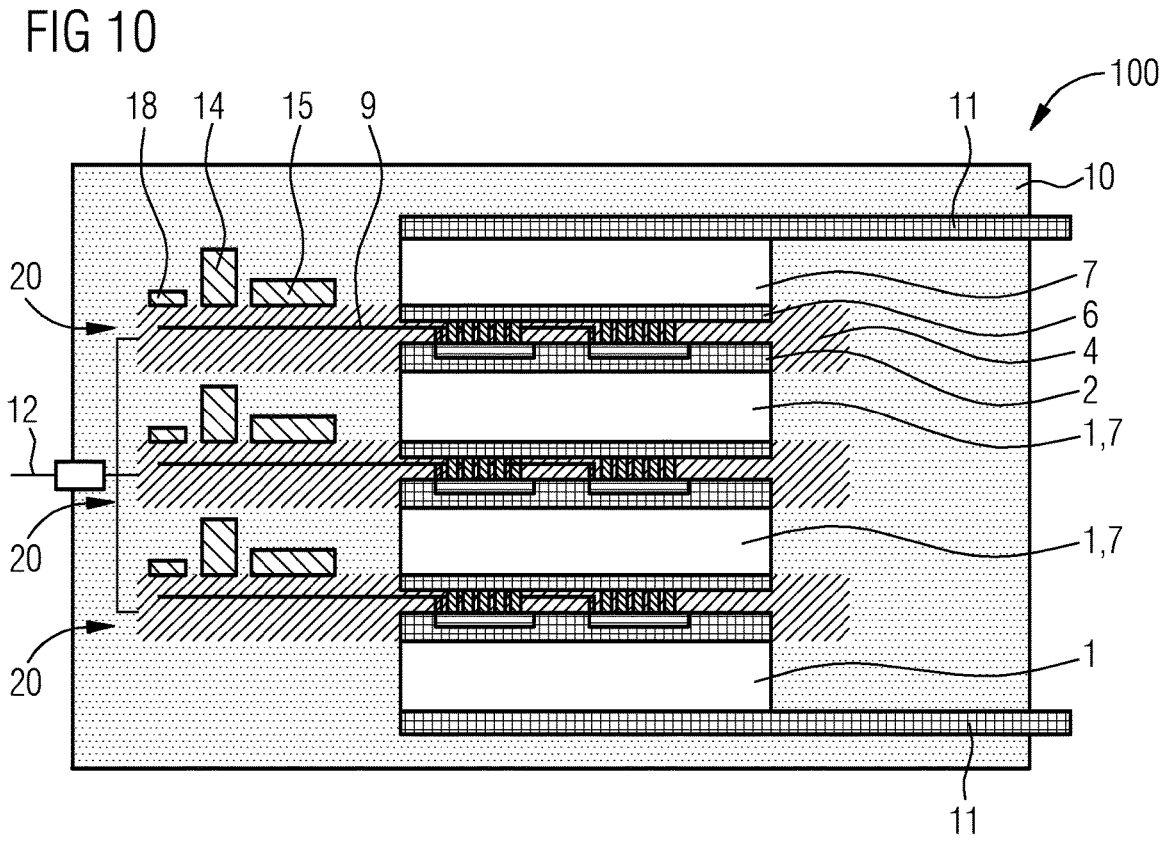

In the Drawings:

FIG. 1 shows a power semiconductor module according to an exemplary implementation in a schematic sectional view, FIGS. 2 to 9 show schematic sectional views of method steps of an exemplary embodiment of a method to manufacture power semiconductor modules described herein, FIG. 10 shows a power semiconductor stack comprising a plurality of power semiconductor modules of FIG. 1 according to an exemplary implementation in a schematic sectional view, and FIGS. 11 to 15 show power semiconductor modules according to further exemplary implementations in a schematic sectional view.

FIG. 1 shows a power semiconductor module 20 according to an implementation in a schematic sectional view. The power semiconductor module 20 comprises, in order from the bottom to the top, a conductive base plate 1, directly on which a conductive base 2 is conductively arranged.

Two power semiconductor devices 3 are conductively arranged and distant from each other with their lower electrode/pole side 32 on the conductive base 2. An insulating spacer layer 4 is directly arranged on the two power semiconductor devices 3 and on the conductive base 2, which may laterally on both sides extend beyond the conductive base 2 and the base plate 1, as depicted in FIG. 1.

For each power semiconductor device 2, for example, five vertical connection elements 5 are passed through the spacer layer 4, thereby conductively conducting an upper electrode/pole side 31 of the respective power semiconductor device 2. Directly on top of the vertical connection elements 5 and on the spacer layer 4 a conductive top 6 is arranged, provided, for example, as a metal plate or as a horizontal redistribution layer. Finally, a conductive top plate 7 is conductively and directly arranged on the conductive top 6. The power semiconductor module thus allows a vertical current flow between the base place 1 and the top plate 7.

As can be seen from FIG. 1, the power semiconductor device 3 on the left side has, compared to the power semiconductor device 3 on the right side, a lesser vertical height, which is compensated by the spacer layer 4 being vertically greater in said area compared to the right side by exploiting a given viscosity of a prepreg material forming the spacer layer 4.

As an option, the spacer layer 4 is composed of a plurality of sub-layers, for example, of a first sub-layer 41 and of a second sub-layer 42. The sub-layers 41, 42 are each prepregs. This allows having an electric wiring 9 within the spacer layer 4.

Subsequently, the vertical length of the vertical connection elements 5 is greater for the power semiconductor device 3 on the left side compared to the power semiconductor device 3 on the right side. In this manner, spring elements for compensating vertical height differences of the power semiconductor devices 3 are not needed.

Accordingly, a shape of a core module 23 is defined by the conductive base 2, the conductive top 6 and the spacer layer 4. The core module 23 has a first mounting plane 21 and a second mounting plane 22 which run parallel with each other with high accuracy. Because of this highly accurate core module 23 that may have a height tolerance of, for example, 10 µm or less, the top plate 7 and the base plate 1 can be pressed to the core module 23. Compared with this tolerance of the core module 23, a height difference between the upper sides 31 of the power semiconductor devices 3 may be up to 0.1 mm due to manufacturing tolerances of the power semiconductor devices 3 and due to height variation of a solder layer or a sinter layer, not shown, that is located between the power semiconductor devices 3 and the conductive base 2.

The power semiconductor devices 3 may be partially embedded in the base leadframe 2 in recesses 8, as shown in FIG. 1, and are bonded to the conductive base 2 that may be a leadframe. The conductive base 2 and the conductive top 6, that may also be a leadframe, can comprise Cu, Mo, CuMo or other possible circuit-carrier materials. The power semiconductor devices 3 are provided as Si, SiC, GaN or other semiconductor substrate materials, for example, like Ga$_2$O$_3$, AlN and/or Diamond. Lateral dimensions of the power semiconductor devices 3 can range, for example, from 1 mm to 3 cm. A thickness of the conductive base 2 is, for example, at least 0.5 mm and at most 10 mm; the same may apply for the conductive top 6.

Device types of the power semiconductor devices 3 may be IGBTs, MOSFETs, Thyristors, Diodes or other power semiconductor device designs.

The vertical connection elements 5 are provided, for example, as vias in the spacer layer 4. The vias 5 may be formed by plating or filling conductive material, like copper, into blind holes drilled into the spacer layer 4. Drilling of blind holes for such vias may be done, for example, by mechanical drilling, like using tungsten carbide bits, or by using laser radiation based drilling technology, as used for drilling holes for microvias, like vias having very small diameters in the submillimeter range. Vertical interconnects as vias 5 may also be realized as metal inserts such as posts, bond spacers or the like, that are bonded to the upper side 31 of the power semiconductor devices 3.

Specifically, first an initial sub-layer 41 is deposited over the conductive base 2 and the power semiconductor devices 3. Vertical gate vias 8a and emitter vias 8b are vertically inserted in the initial sub-layer 41, conductively contacting the gate and emitter of the power semiconductor device 3, respectively, and connected to a horizontal gate conductor 9 and an emitter layer, for example, integrated in the conductive top 6, arranged on top of the initial sub-layer 41. The horizontal gate conductor 9 extends laterally beyond the conductive top 6 and the conductive base 2.

A second sub-layer 42 is then deposited over the initial sub-layer 41 such that the gate and emitter redistribution layers 9a, 9b are sandwiched between the two sub-layers 41, 42. Further lamination sub-layers, not shown, can be deposited onto the two sandwiched laminated sub-layers 41, 42, for example, laterally besides and thus outside the conductive top 6 and the conductive base 2, as indicated in FIG. 1. The thus resulting spacer layer 4 can be made from typical prepreg materials as used in semiconductor packaging, with a filler and a matrix, or from compression molding with epoxy mold compound materials.

While FIG. 1 shows only one layer of power semiconductor devices 3 in parallel with the mounting planes 21, 22, a plurality of conductive bases 2, at least two power semiconductor devices 3, spacer layers 4, conductive tops 6 and at least two vertical connection elements 5 can be arranged consecutively one above the other along a direction perpendicular with the mounting planes 21, 22, with the top plate 7 and the base plate 1 encompassing such a stack. The top plate 7 and the base plate 1 can each be equipped with a cooling channel, not shown, for cooling the two power semiconductor devices 3. In such a way the power semiconductor devices 3 can be cooled from above and below.

In FIGS. 2 to 9, a method for producing power semiconductor modules 20 is illustrated. According to FIG. 2, the conductive base 2 is provided, and the power semiconductor devices 3 are arranged onto the conductive base 2, for example, by means of sintering. The power semiconductor devices 3 may have different heights that are to be compensated for. Contrary to FIG. 1, the conductive base 2 of FIG. 2 has no recesses for the power semiconductor devices and, therefore, is flat. The same can apply to all other exemplary embodiments.

Figure 3:
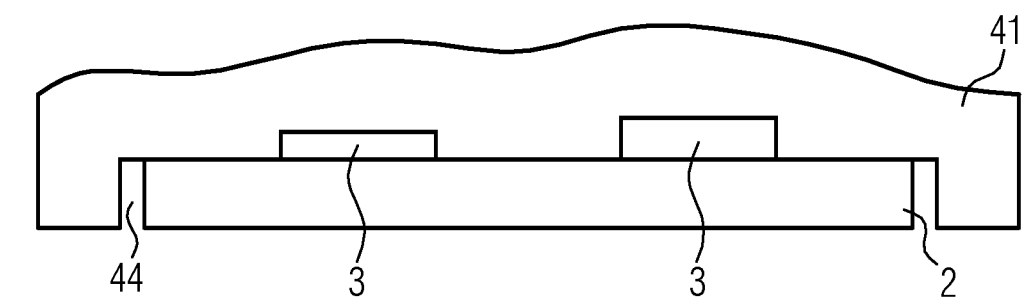

According to FIG. 3, the first sub-layer 41 is applied as a prepreg. Hence, in the step of FIG. 3, the sub-layer 41 is still comparably soft and has not yet been fully cured. In addition, it is possible to pre-machine the pregreg in order to compensate the assembly height differences for a better plane-parallel lamination process. Hence, there can be a pre-machined recess for the conductive base 2 in the sub-layer 41.

Figure 4:
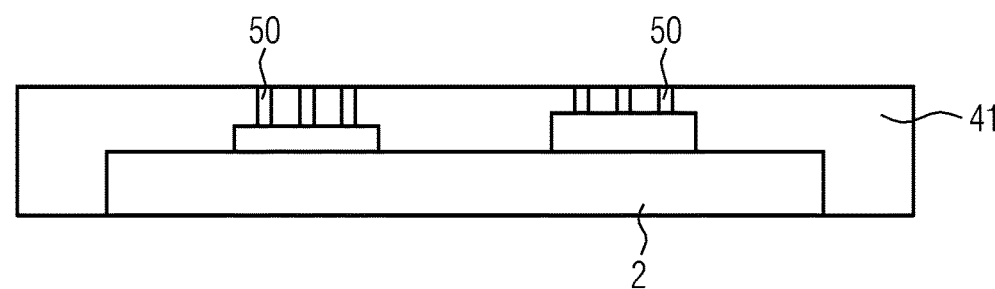

In the step of FIG. 4, the sub-layer 41 has been cured and brought into the desired shape, for example, by pressing. Accordingly, the shape of the sub-layer 41 can be defined in an exact manner by using a pressing tool, not shown. For example, the sub-layer 41 then terminates flush with a side of the conductive base 2 remote from the semiconductor devices 3.

Then, holes 50 for the later gate vias 8a and emitter vias 8b are formed into the sub-layer 41. The holes 50 run completely through the sub-layer 41 down to the power semiconductor devices 3. Top sides of the power semiconductor devices 3, which may be provided with at least one metallization, can thus serve as a drilling stop.

Figure 5:
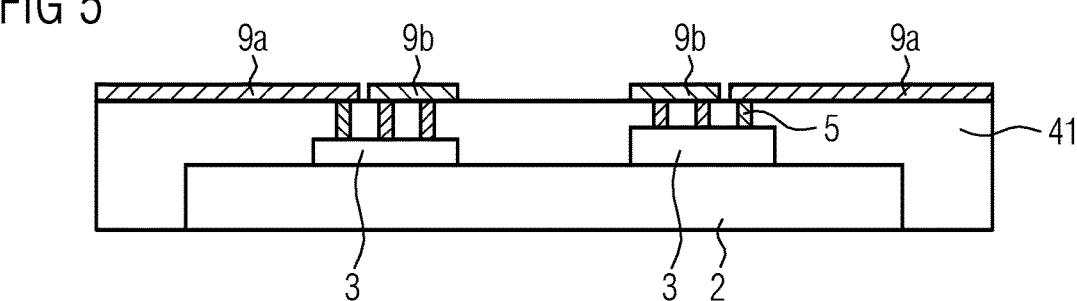

Then, see FIG. 5, the holes 50 are filled to create the vertical connection elements 5, also referred to as vias. As an option, an electric wiring by redistribution layers 9a, 9b is applied onto the cured first sub-layer 41. The redistribution layers 9a for the gate contacts may be shaped as conductor tracks, and the redistribution layers 9b for the emitter contacts may be metallization areas of, for example, rectangular or circular shape when seen onto the sub-layer 41.

Figure 6:
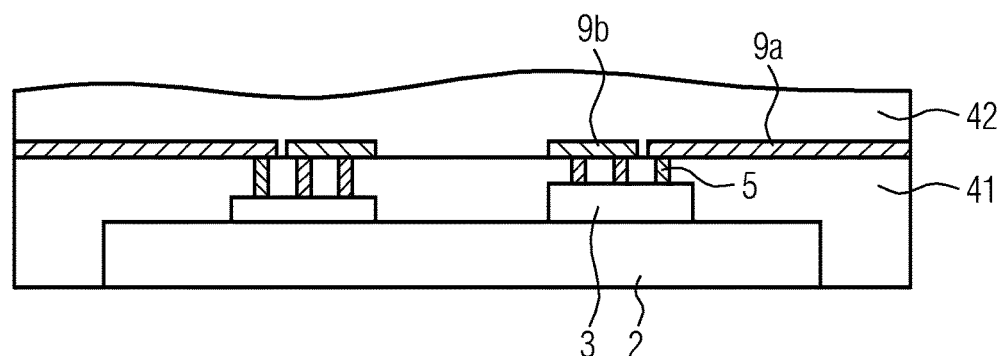

In a next, optional step, if required, the second sub-layer 42 is applied, again, for example, as a prepreg, see FIG. 6.

Figure 7:
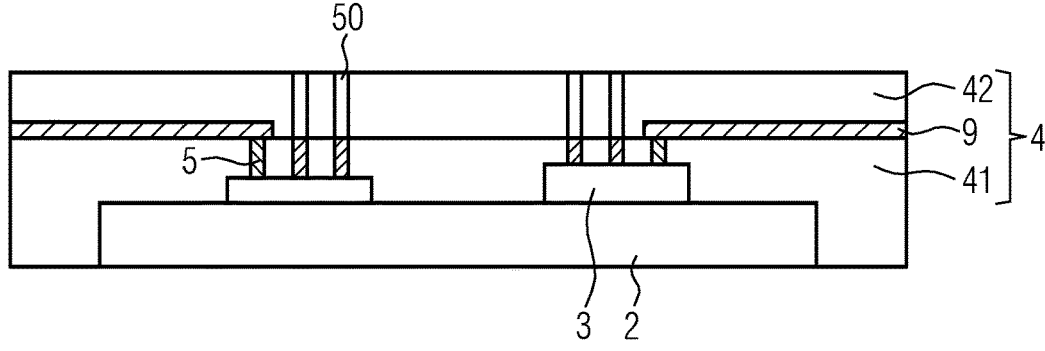

According to FIG. 7, the sub-layer 42 has been cured and shaped, for example, again by means of pressing. Then, the holes 50 through the second sub-layer 42 are created. The holes 50 run again through the added sub-layer 42 down to the previously filled holes for the emitter vias 8b. The optional redistribution layers 9b on top of the sub-layer 41 are not shown in FIGS. 7, 8 and 9, but can also be present as in FIGS. 5 and 6.

Next, see FIG. 8, all the vertical connection elements 5 are created by filling the holes 50 to produce the vias 8a, 8b.

As a further option, see also FIG. 8, a cover layer 91 may be applied over the vertical connection elements 5 on the second sub-layer 42. The cover layer 91 may be a metallic layer. By means of the cover layer 91, a thickness and evenness of the resulting spacer layer 4 can be adjusted with high accuracy and, hence, the spacer layer 4 can ensure plane-parallelism.

In FIG. 9 it is shown that the conductive top 6 is applied so that the core module 23 and, hence, the power semiconductor module 20 is finished, having the plane-parallel mounting planes 21, 22.

Otherwise, the same as to FIG. 1 applies to the power semiconductor module 20 of FIG. 9.

FIG. 10 shows a power semiconductor stack 100 comprising a plurality of the power semiconductor modules 20 as described before in FIG. 1, which are arranged one above the other. Between two adjacent power semiconductor modules 20, the base plate 1 of each upper power semiconductor module 20 forms the top plate 7 of each respective lower power semiconductor 20 module, so that each adjacent upper power semiconductor module 20 and the respective lower power semiconductor module share a common base plate 1 and a common top plate 7, respectively.

The power semiconductor modules 20 can be arranged in an optional common housing 10 having an inside encapsulation material for dielectric insulation and providing explosion protection. High voltage, HV, terminals 11 are passed through the housing 10 and are connected to the upmost top plate 7 and to the lowest base plate 1 of the power semiconductor modules 20. For example, the three gate conductors 9 connecting to the respective gates of the power semiconductor devices 3 are connected together and passed through the housing 10 as control signal contact 12.

The spacer layer 4 may significantly project beyond the plates 1, 7. Hence, the spacer layer 4 can serve as a circuit board to carry gate drive logic components 14 and/or at least one sensor 15. To apply, for example, control signals for the power semiconductor modules 20, there can be a control signal contact 12 provided at the circuit board-like section of the spacer layer 4, for example.

As a further option, there can be a further electric component 18 like an integrated circuit. The same applies to all other exemplary embodiments.

Otherwise, the same as to FIGS. 1 to 9 applies to the power semiconductor module 20 of FIG. 10.

Figure 11:
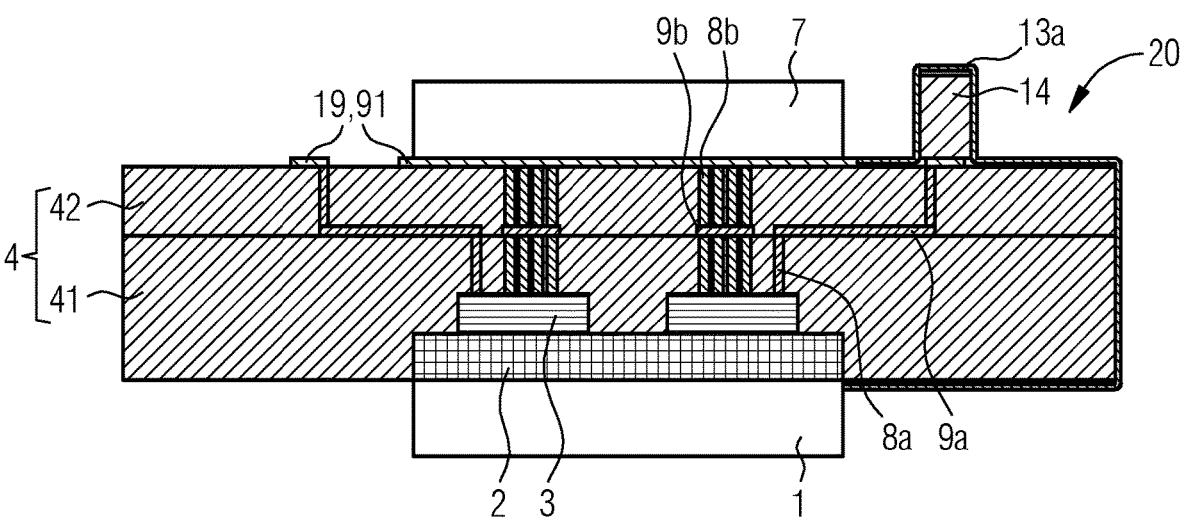

In FIG. 11 it is illustrated that there can be a passivation coating 13a around the spacer layer 4 to enhance creepage distance of the power semiconductor modules 20. The passivation coating 13a may extend to both main sides of the spacer layer 4 or may be limited to a single main side of the spacer layer 4 and/or to a lateral side of the spacer layer 4.

Moreover, as possible in all other exemplary embodiments, according to FIG. 11 the cover layer 91 may be structured to form electric contact areas 19 that are located, for example, at the second sub-layer 42.

Otherwise, the same as to FIGS. 1 to 10 applies to the power semiconductor module 20 of FIG. 11.

Figure 12:
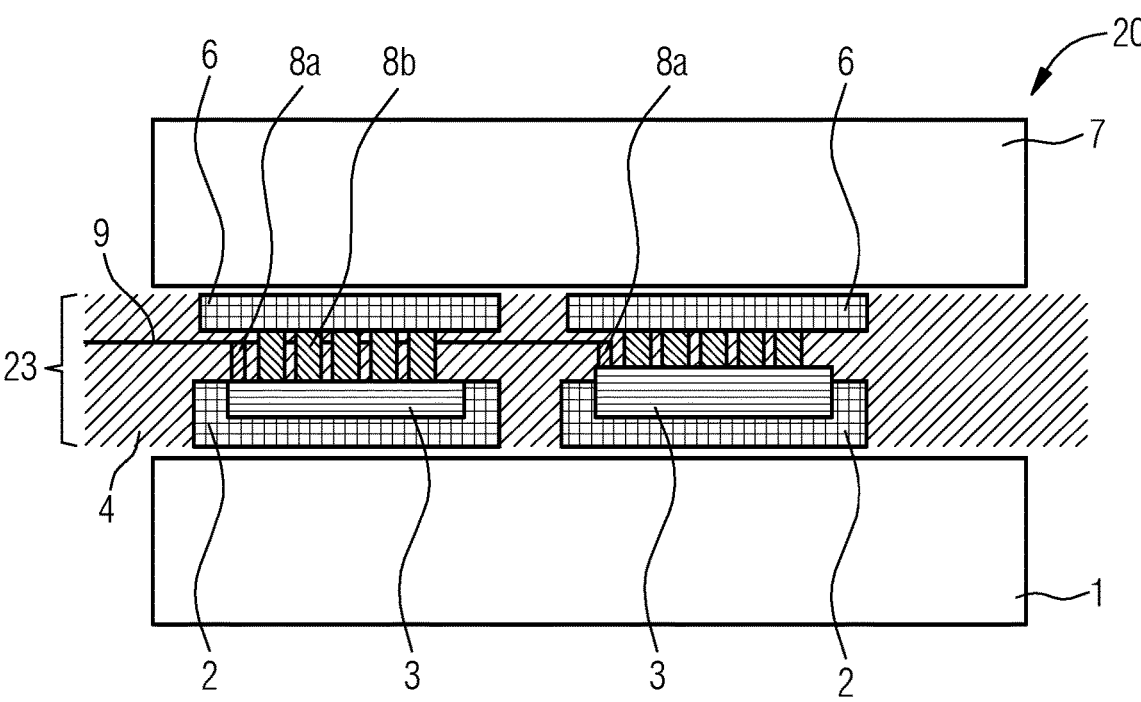

FIG. 12 shows a power semiconductor module 20 according to a further implementation in a schematic sectional view. Different to the power semiconductor module of FIG. 1, said implementation comprises at least two conductive bases 2 and at least two conductive tops 6 separated from each other for reducing warpage and thermomechanical stresses. Each of the two conductive bases 2 and conductive tops 6 is associated to exactly one of the power semiconductor devices 3. For assembly of such a design, it is an option to temporarily bond the conductive bases 2 on a common carrier, not shown, with a release film and to remove said common carrier after the spacer layer 4, or at least one sub-layer of the spacer layer 4, is completed.

Otherwise, the same as to FIGS. 1 to 11 applies to the power semiconductor module 20 of FIG. 12.

Figure 13:
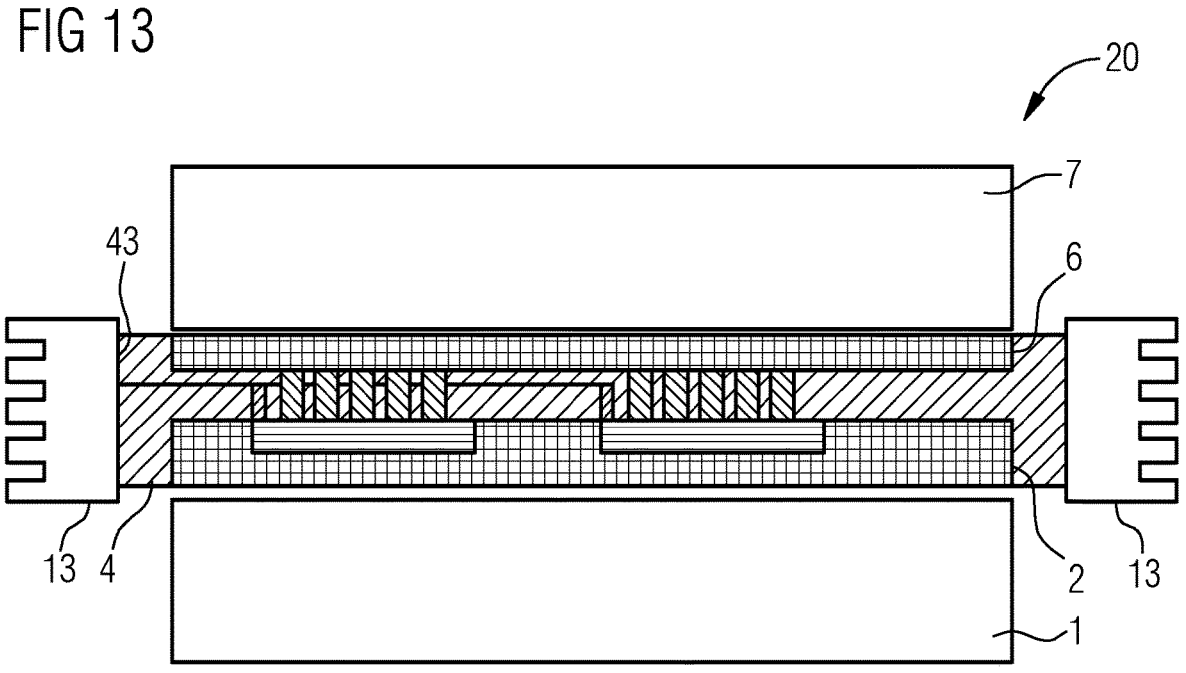

FIG. 13 shows a power semiconductor module with a creepage distance enhancer 13 provided as a ring structure and arranged around lateral sides 43 of the spacer layer 4. Thus, the creepage distance enhancer 13 can be a closed ring completely surrounding the spacer layer 4 in a lateral direction, which is a direction perpendicular to the conductive base 2 and the conductive top 6. The spacer layer 4 may alternatively of additionally comprise a passivation coating as illustrated in FIG. 11.

Otherwise, the same as to FIGS. 1 to 12 applies to the power semiconductor module 20 of FIG. 13.

Figure 2:
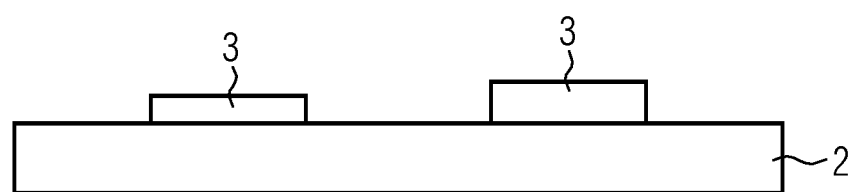
Figure 14:
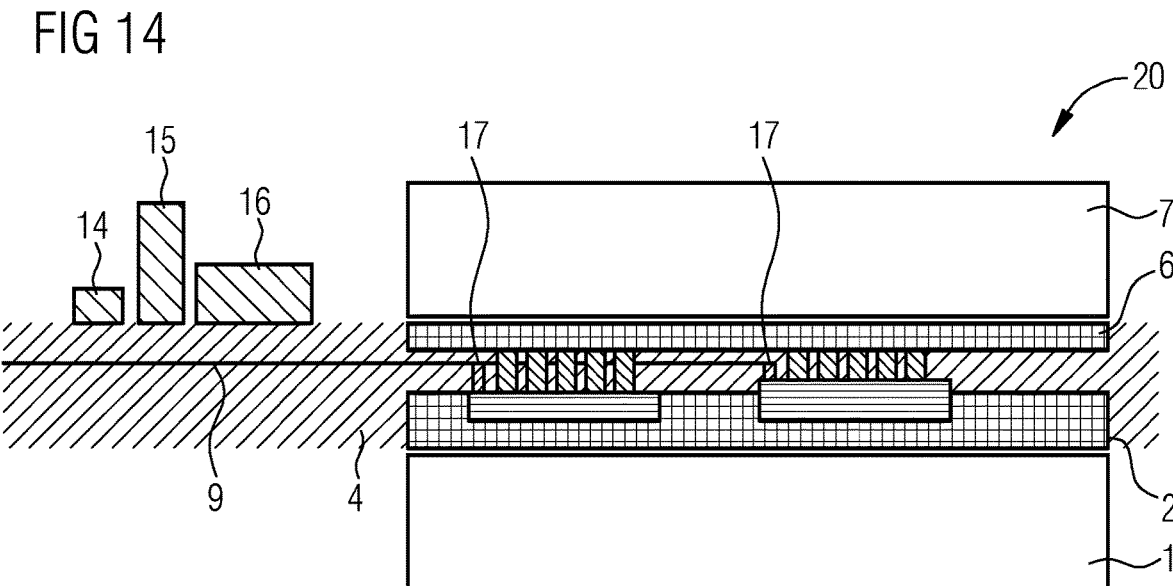
Figure 15:
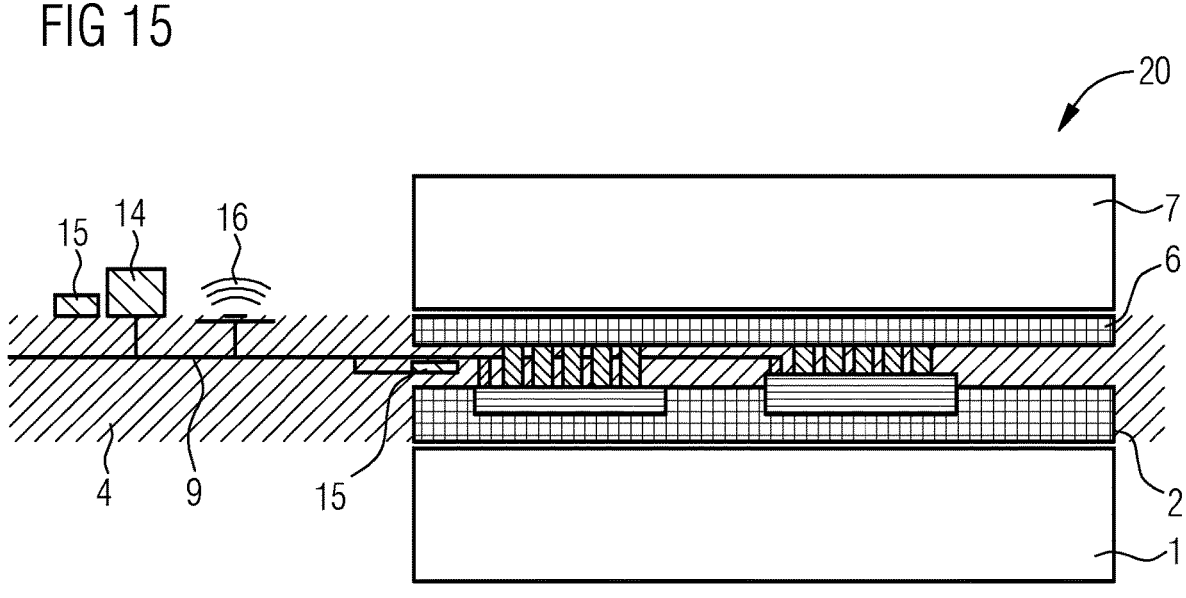

FIGS. 14 and 15 show a power semiconductor module with gate drive logic components 14 connected to a gate of the power semiconductor devices 3, a sensor 15 and a communication component 16 arranged onto, as shown in FIGS. 5 and 2, or within the spacer layer 4, as shown in FIG. 6.

The gate drive logic component 14 arranged onto the spacer layer 4 are connected, as shown in FIG. 6, for example, to the gate conductor 9 of which a vertical part extends vertically upwards through the spacer layer 4 into the gate drive logic component 14. The gate drive logic component 14 may be an electronics circuit providing modulation, control and protection of the respective gate of the power semiconductor devices 3, and also may comprise electrical connections to emitter and collector potentials of the power semiconductor devices 3. Likewise, a second sensor 15 may be arranged within the spacer layer 4, as illustrated in FIG. 6, and may be connected as a separate signal to the gate drive logic component 14.

Said sensors 15 may include sensors for temperature, magnetic field, humidity, vibration, strain and/or may be provided as an integrated wireless chip with embedded RF communication. Communication components 16 may include radiofrequency, infrared, optical and inductive transceivers, whereby embedded metallization structures of the communication components 16 may act as micro-patch or dipole antennas for RF/microwave communication.

A plurality of sensors 15 and/or communication components 16 can be provided to map the temperature across the module and across different modules of the stack. Thereby, each power semiconductor device 3 may comprise an unique ID and can be addressed individually. Thereby, said plurality of sensors 15 and/or communication components 16 may comprise energy scavenging capabilities, and, for example, could be powered wirelessly. Thus, depending on the electromagnetic design of the power semiconductor module 20 additional cables to control the power semiconductor devices 3 may can be omitted.

In addition, power semiconductor devices 3 may be controlled by chip-individual gate lines via gate vias 8a. In a case of failure of a semiconductor device 3, the gate line of the failing semiconductor device 3 can be fused-out by switches 17 and separated from the healthy semiconductor devices. In case of a fail-to-short of the semiconductor device 3, the remaining semiconductor devices can be turned on to support the current carrying capability of the power module which is needed for series connected module applications. Alternatively, all gates of all semiconductor devices 3 can be switched off by a single switch 17.

Otherwise, the same as to FIGS. 1 to 13 applies to the power semiconductor modules 20 of FIGS. 14 and 15.

While the invention has been illustrated and described in detail in the drawings and foregoing description, such illustration and description are to be considered illustrative or exemplary and not restrictive; the invention is not limited to the disclosed implementations. Other variations to be disclosed implementations can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

This patent application claims the priority of European patent application 20202018.6-1212, the disclosure content of which is hereby incorporated by reference.

REFERENCE SIGNS LIST 1 base plate
2 conductive base
3 power semiconductor device
31 upper side of the power semiconductor device 32 lower side of the power semiconductor device
4 spacer layer
41 first insulating sub-layer of the spacer layer
42 second insulating sub-layer of the spacer layer
43 lateral side of the spacer layer
44 pre-machined recess
5 vertical connection element
50 hole
6 conductive top
7 top plate
8 recess
8*a* gate via
8*b* emitter via
9*a* redistribution layer (for example, for a gate)
9*b* redistribution layer (for example, for an emitter)
91 cover layer
10 housing with encapsulation
11 terminal
12 control signal contact
13 creepage distance enhancer
13*a* passivation coating
14 gate drive logic component
15 sensor
16 communication component
17 switch
18 further electric component
19 electric contact area
20 power semiconductor module
21 first mounting plane
22 second mounting plane
23 core module
100 power semiconductor stack
The invention claimed is:

1. A power semiconductor module comprising
at least one conductive base,
at least one conductive top,
at least two power semiconductor devices arranged
between the at least one conductive base and the at least
one conductive top, the semiconductor devices are each
configured for a current of at least 1 A and/or for a
voltage of at least 50 V,
an insulating spacer layer arranged on the power semi-
conductor devices and at least partially between the at
least one conductive base and the at least one conduc-
tive top, and
at least two vertical connection elements passing from the
power semiconductor devices through the spacer layer
and conductively connecting the at least one conductive
top with each of the power semiconductor devices,
wherein
the spacer layer and the vertical connection elements
are configured for compensating height differences
of the power semiconductor devices,
the spacer layer comprises at least two insulating
sub-layers arranged one above the other, an electric
wiring is provided between the at least two insulating
sub-layers,
on a side of the electric wiring facing the power
semiconductor devices as well as on a side of the
electric wiring remote from the power semiconduc-
tor devices and through each one of the at least two
insulating sub-layers, there is at least one of the at
least two vertical connection elements, and
the spacer layer is directly arranged on the at least two
power semiconductor devices and on the conductive
base and extends laterally on both front sides beyond
the conductive base, and the at least one conductive top is arranged directly on top of the vertical con-
nection elements and directly on the spacer layer.
2. The power semiconductor module of the previous claim
1,
wherein the at least one conductive base and the at least
one conductive top respectively define two parallel
mounting planes, and
wherein the spacer layer protrudes laterally from the at
least one conductive base and the at least one conduc-
tive top and terminates flush with the mounting planes
in a direction perpendicular with the mounting planes.
3. The power semiconductor module of claim 1, compris-
ing a gate conductor connected to respective gates of the
power semiconductor devices and embedded within the
spacer layer.
4. The power semiconductor module of claim 1, wherein
the sub-layers each include fibers and a matrix material.
5. The power semiconductor module of claim 1, compris-
ing a conductive base plate and a conductive top plate,
whereby the at least one conductive base is arranged on the
base plate and the top plate is conductively arranged on the
at least one conductive top, so that the at least one conduc-
tive base, the at least one conductive top, and the spacer
layer are sandwiched between the base plate and the top
plate.
6. The power semiconductor module of claim 5, whereby
at least one of the base plate and the top plate comprise a
cooling channel for cooling the power semiconductor
devices.
7. The power semiconductor module of claim 1,
wherein there is exactly one conductive base carrying all
the power semiconductor devices, and
wherein there is exactly one conductive top,
wherein at least one of the conductive base and the
conductive top comprises at least one of Cu, Mo, Fe,
Ni, Al, and Co.
8. The power semiconductor module of claim 1, compris-
ing at least one of
at least two of the conductive bases and
at least two of the conductive tops
separated from each other and each associated to at least
one of the power semiconductor devices,
wherein between adjacent conductive bases and/or con-
ductive tops, respectively, along a lateral direction there
is only the spacer layer.
9. The power semiconductor module of claim 1, compris-
ing at least one of
at least one creepage distance enhancer arranged at at
least one lateral side of the spacer layer and
the spacer layer having a passivation coating.
10. The power semiconductor module of claim 1, wherein
the spacer layer directly adjoins the at least one conductive
base, the at least one conductive top, each one of the power
semiconductor devices and each one of the vertical connec-
tion elements.
11. The power semiconductor module of claim 1,
wherein the at least one conductive base comprises at
least one recess whereas in total there is a plurality of
the recesses, and
wherein the power semiconductor devices are each par-
tially or completely located in one of the recesses so
that there is a one-to-one assignment between the
recesses and the power semiconductor devices.
12. A power semiconductor stack comprising a plurality
of the power semiconductor modules of claim 1 arranged one above the other, wherein the power semiconductor modules are pressed together with a pressure of at least 0.5 kN/cm2.

13. A method for manufacturing a power semiconductor module comprising the steps of conductively bonding at least two power semiconductor devices on at least one conductive base, the semiconductor devices are each configured for a current of at least 1 A and/or for a voltage of at least 50 V, arranging an insulating spacer layer on the power semiconductor devices and on the at least one conductive base, passing thereafter at least two vertical connection elements through the spacer layer or attaching, prior to arranging the spacer layer, bond spacers as the vertical connection elements to the power semiconductor devices, for conductively connecting each of the power semiconductor devices thereby compensating possible height differences of the power semiconductor devices, and arranging at least one conductive top on the spacer layer and conductively on the vertical connection elements, wherein the spacer layer comprises at least two insulating sub-layers arranged one above the other, an electric wiring is provided between the at least two insulating sub-layers, on a side of the electric wiring facing the power semiconductor devices as well as on a side of the electric wiring remote from the power semiconductor devices and through each one of the at least two insulating sub-layers, there is at least one of the at least two vertical connection elements, and the spacer layer is directly arranged on the at least two power semiconductor devices and on the conductive base and extends laterally on both front sides beyond the conductive base, and the at least one conductive top is arranged directly on top of the vertical connection elements and directly on the spacer layer.

14. The method according to claim 13, comprising the steps of conductively arranging the at least one conductive base with the power semiconductor devices, the at least two vertical connection elements and the at least one conductive top on a conductive base plate that is configured for cooling the power semiconductor devices, and conductively arranging a conductive top plate on the at least one conductive top, wherein electrical contacts between the base plate and the at least one conductive base, and between the top plate and the at least one conductive top, respectively, are dry contacts.

15. The method according to claim 13, comprising the steps of arranging the at least two insulating sub-layers on top of each other to create the spacer layer, the sub-layers are prepregs.

16. The method of claim 13, wherein the at least one conductive base and the at least one conductive top respectively define two parallel mounting planes, and wherein the spacer layer protrudes laterally from the at least one conductive base and the at least one conductive top and terminates flush with the mounting planes in a direction perpendicular with the mounting planes.

17. The method of claim 13, further comprising embedding a gate conductor within the spacer layer, and connecting the gate conductor to respective gates of the power semiconductor devices.

18. The method of claim 13, wherein the sub-layers each include fibers and a matrix material.

19. The method of claim 13, further comprising arranging the at least one conductive base on a conductive base plate, and conductively arranging a top plate on the at least one conductive top, so that the at least one conductive base, the at least one conductive top, and the spacer layer are sandwiched between the base plate and the top plate.

20. The method of claim 19, whereby at least one of the base plate and the top plate comprises a cooling channel for cooling the power semiconductor devices.

* * * * *